United States Patent
Glebov et al.

(10) Patent No.: US 6,603,915 B2
(45) Date of Patent: Aug. 5, 2003

(54) INTERPOSER AND METHOD FOR PRODUCING A LIGHT-GUIDING STRUCTURE

(75) Inventors: Alexei Glebov, San Bruno, CA (US); Mark McCormack, Livermore, CA (US)

(73) Assignee: Fujitsu Limited, Kawasaki (JP)

( * ) Notice: Subject to any disclaimer, the term of this patent is extended or adjusted under 35 U.S.C. 154(b) by 127 days.

(21) Appl. No.: 09/777,779

(22) Filed: Feb. 5, 2001

(65) Prior Publication Data

US 2003/0103712 A1 Jun. 5, 2003

(51) Int. Cl.[7] .................................................. G02B 6/12
(52) U.S. Cl. ........................................ 385/129; 385/130
(58) Field of Search ............................. 385/14, 129, 130, 385/131

(56) References Cited

U.S. PATENT DOCUMENTS 6,222,974 B1 * 4/2001 Nagata .......................... 385/129
6,298,177 B1 * 10/2001 House ............................ 385/3
6,312,581 B1 * 11/2001 Bruce et al. ..................... 385/14
6,370,307 B1 * 4/2002 Bruce et al. ................... 385/130

* cited by examiner

Primary Examiner—Michael P. Stafira
Assistant Examiner—Juan D Valentin, II
(74) Attorney, Agent, or Firm—Sheppard Mullin Richter & Hampton LLP

(57) ABSTRACT

An interposer and method for producing an interposer. The method comprises forming in a substrate a cladding layer having a known density value; and forming in the substrate a waveguide core layer in contact with the cladding layer and also having a known density value which is greater than the density value of the cladding layer. The method further includes forming in the substrate a second cladding layer in contact with the waveguide core layer and having a known density value less than the density value of the waveguide core layer. A method for producing a light-guiding structure comprising forming in a substrate a cladding layer having a top substrate surface and a porosity value; and forming in the substrate a waveguide core layer in contact with the cladding layer and having a porosity value less than the porosity value of the cladding layer. The method also includes forming in the substrate another cladding layer in contact with the waveguide core layer and having a porosity value greater than the porosity value of the waveguide core layer. The two cladding layers and the waveguide core layer terminate in the top substrate surface of the substrate.

14 Claims, 5 Drawing Sheets

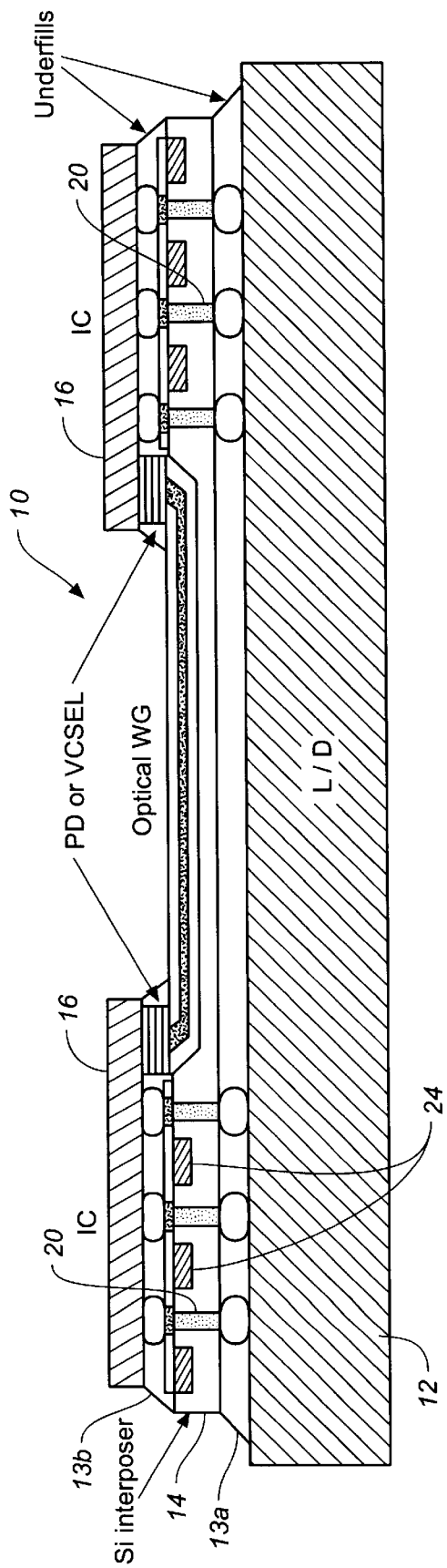
FIG._1

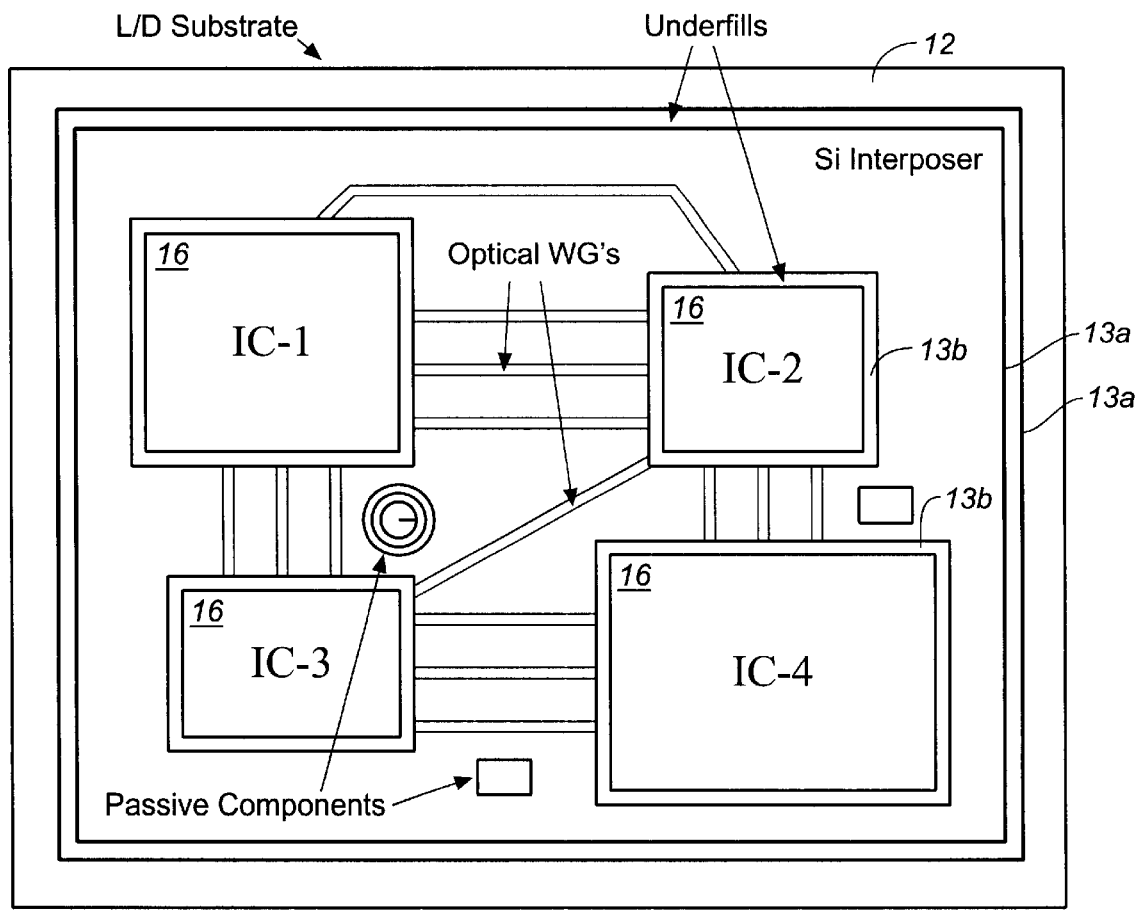
FIG._2

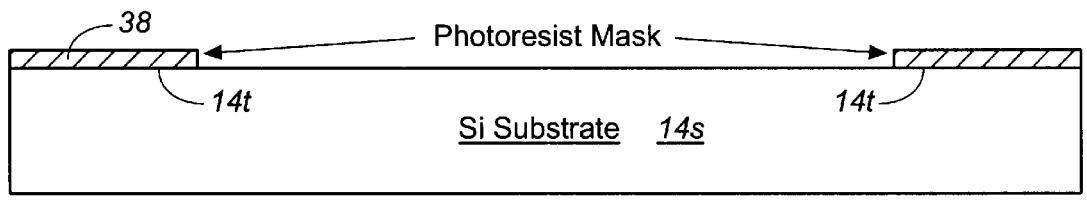
FIG._3
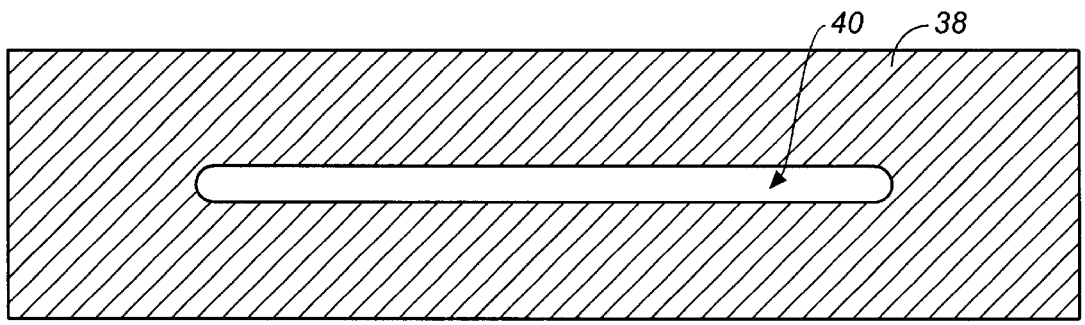
FIG._4
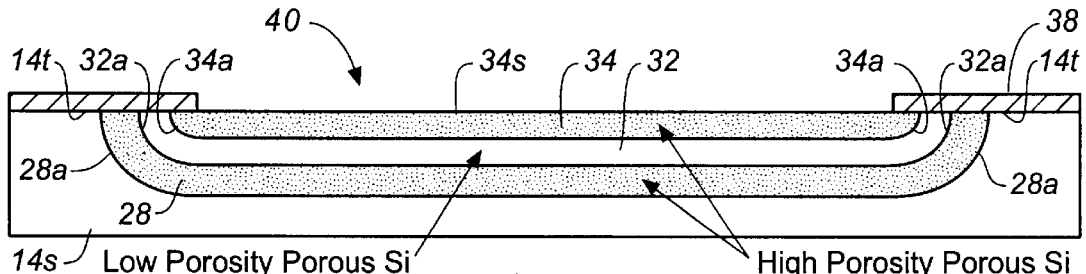
FIG._5
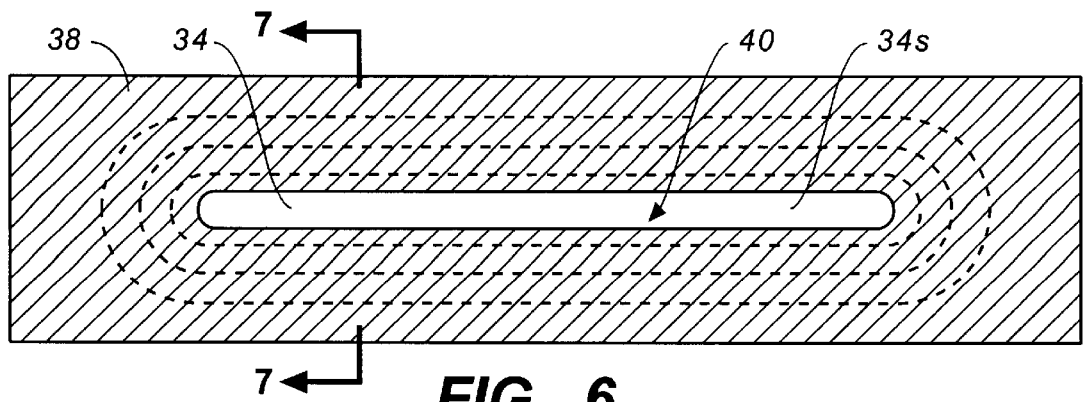
FIG._6

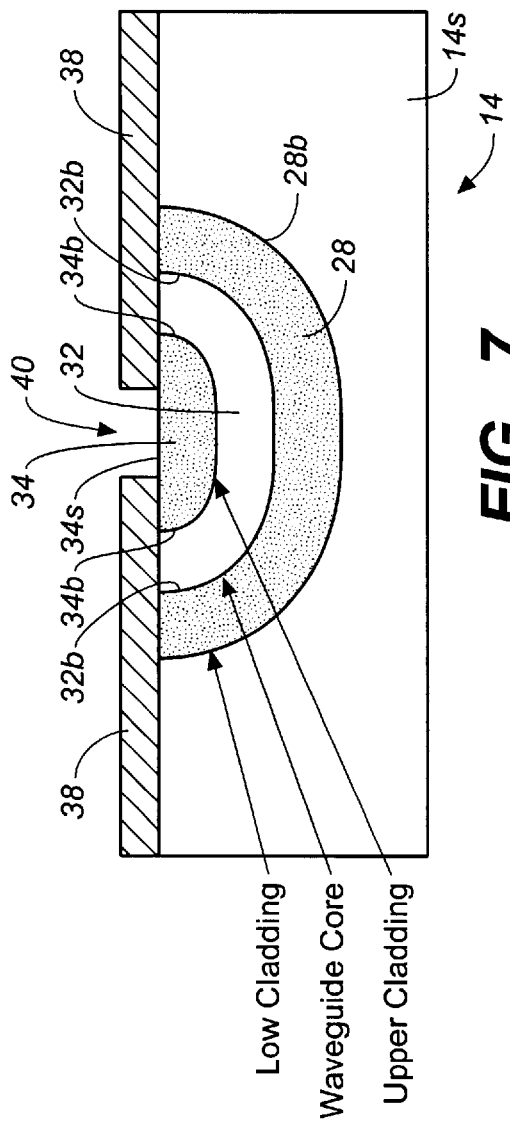
FIG._7
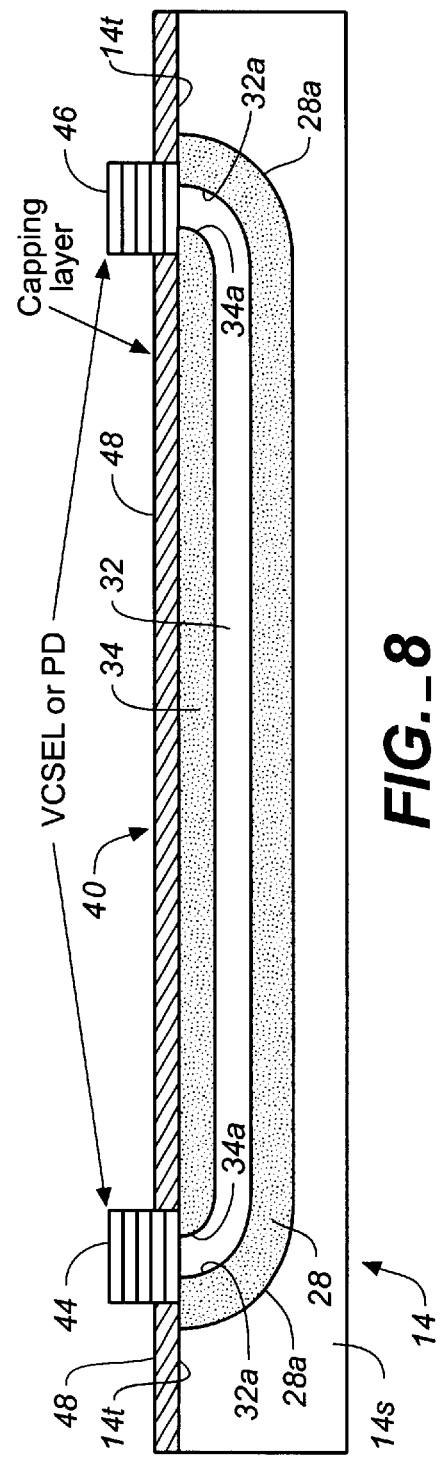
FIG._8

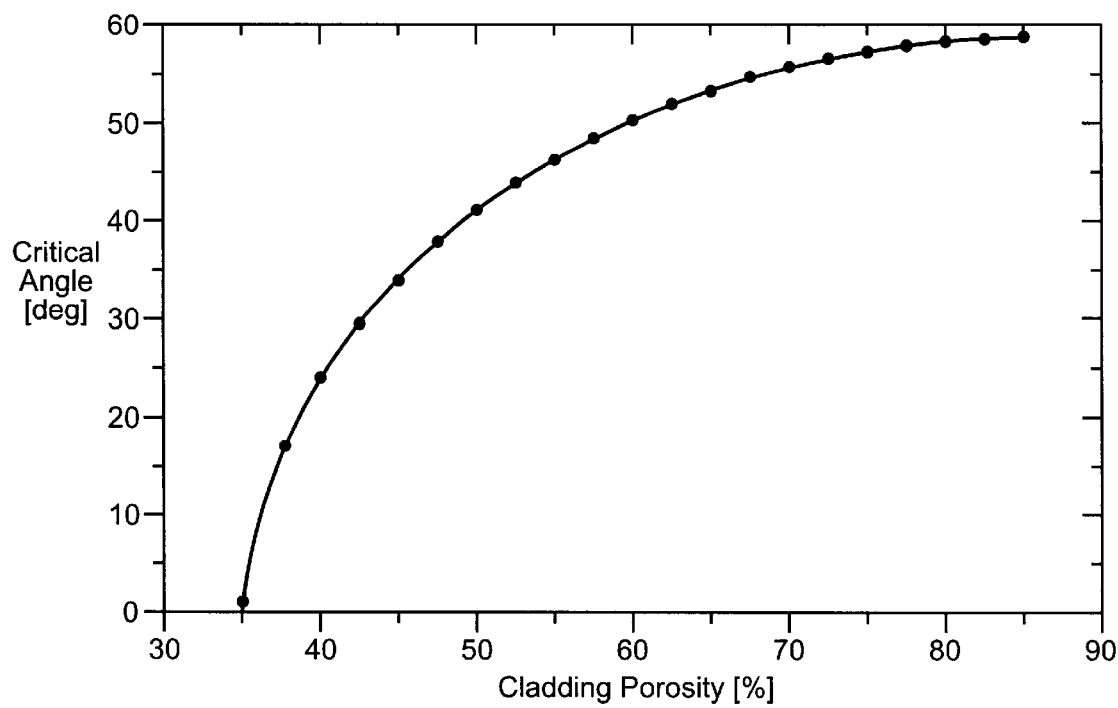
FIG._9
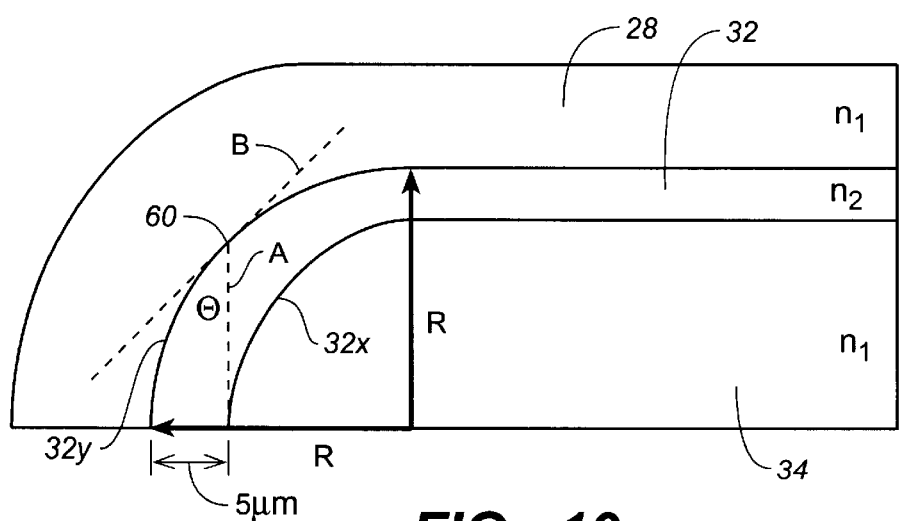
FIG._10

INTERPOSER AND METHOD FOR PRODUCING A LIGHT-GUIDING STRUCTURE

BACKGROUND OF THE INVENTION

1. Field of the Invention

This invention relates to an interposer and method for producing same. More specifically, the present invention provides for an interposer with at least one optical waveguide, and a method for producing a light-guiding structure.

2. Description of the Prior Art

Silicon interposers have been used in integrated circuit packages to provide high density and functionality of the packages. A silicon interposer can perform several functions. It can contain imbedded passive components, bringing them closer to the chip and, therefore, reducing parasitic interconnect inductance. It allows coefficient of thermal expansion matching between the integrated circuit and printed circuit board, and therefore, improves mechanical robustness of the package. With increase of operational frequencies of integrated circuit's and interconnect density, interchip transmission line delays become a very important issue.

The major causes for these delays are capacitive loading of the lines and the line resistivity, which both limit the phase velocity of the propagating signal. To reduce resistivity and capacitive delays the following two approaches may be used: decreasing dielectric constant of the interlayer dielectric, and reducing the metal line resistivities. Both approaches have very strong physical limitations. A great advantage of an optical interconnect is that it is free of capacitive loading and also there is no cross-coupling between optical signals propagating in waveguides, even at a very close distance from each other. Transmission over optical lines is thus much faster compared to their electrical counterparts. Moreover, light can be transmitted through free-space that can also be useful for vertical signal transmission. This can find a broad range of application in three dimensional structures. Therefore, what is needed and what has been invented is an interposer without the features of capacitive loading of the lines and line resistivity.

SUMMARY OF THE INVENTION

The present invention provides a method for producing light-guiding structure comprising providing a substrate (e.g., a silicon substrate) having a top substrate surface; forming in the substrate a lower cladding layer (e.g., a silicon cladding layer) having a lower porosity value; forming in the substrate a waveguide core layer in contact with the lower cladding layer and having a porosity value less than the porosity value of the lower cladding layer; and forming in the substrate an upper cladding layer (e.g., a silicon cladding layer) in contact with the waveguide core layer and having a porosity value greater than the porosity value of the waveguide core layer. The method of the present invention further provides terminating the lower cladding layer, the waveguide core, and the upper cladding layer in the top substrate surface. The upper cladding layer has a top cladding surface which is preferably generally aligned with the top substrate surface. The porosity value of the lower cladding layer generally equals the porosity value of the upper cladding layer. The upper cladding layer, the waveguide core layer, and the lower cladding layer are preferably formed in sequence by electrochemical etching, commencing with the upper cladding layer. After formation, the three formed layers may be simultaneously expanded by oxidation. Thus, the waveguide core layer may be expanded (e.g., by oxidizing) simultaneously with the upper cladding layer and the lower cladding layer.

The present invention also provides a method for producing an interposer comprising: providing a substrate; forming in the substrate a lower cladding layer having a lower cladding density value; forming in the substrate a waveguide core layer in contact with the lower cladding layer and having a core density value greater than the density value of the lower cladding layer; and forming in the substrate an upper cladding layer in contact with the waveguide core layer and having density value less than the core density value.

The present invention further also provides an interposer comprising a silicon body having a silicon surface, a lower cladding layer including a pair of lower opposed cladding layer ends and extending through the silicon body and having the lower opposed cladding layer ends terminating in the silicon surface. A core layer is formed to include a pair of opposed core layer ends and extend through the silicon body in contact with the lower cladding layer and having the opposed core layer ends terminating in the silicon surface. The interposer also includes an upper cladding layer including an upper cladding surface and disposed in the silicon body in contact with the core layer and such that the upper cladding surface is generally aligned with the silicon surface. The lower cladding layer and the upper cladding layer preferably have a porosity ranging from about 40% to about 60%. The core layer has a porosity which is less than the porosity of the lower and upper cladding layers. The core layer preferably has a porosity ranging from about 25% to about 50%.

These provisions together with the various ancillary provisions and features which will become apparent to those skilled in the art as the following description proceeds, are attained by the methods and interposers of the present invention, preferred embodiments thereof being shown with reference to the accompanying drawings, by way of example only, wherein:

BRIEF DESCRIPTION OF THE DRAWINGS

FIG. 1 is a vertical sectional view illustrating a substrate, such as a printed circuit board, supporting a silicon interposer having an integrated optical waveguide;

FIG. 2 is a top plan view of the substrate of FIG. 1 supporting a silicon interposer having integrated optical waveguides which are in optical devices that are electrically coupled to integrated circuits;

FIG. 3 is a side elevational view of a substrate supporting a photoresist mask;

FIG. 4 is a top plan view of the photoresist mask and substrate of FIG. 3;

FIG. 5 is a vertical sectional view of the photoresist mask and substrate after two high-porosity silicon cladding layers and a low-porosity silicon waveguide core layer were formed in the interposer;

FIG. 6 is a top plan view of the photoresist mask and substrate of FIG. 5;

FIG. 7 is a vertical sectional view taken in direction of the arrows and along the plane of line 7—7 in FIG. 6;

FIG. 8 is a side elevational view of the silicon substrate in FIG. 5, after the photoresist mask was removed and after a pair of optical devices were disposed in communication with the low-porosity silicon waveguide layer, and after a capping layer was disposed on a surface of the substrate;

FIG. 9 is a graph reflecting optical internal reflection as a function of waveguide cladding porosity; and FIG. 10 is a partial vertical sectional view of the interposer containing optical light bending properties.

DETAILED DESCRIPTION OF PREFERRED EMBODIMENTS OF THE INVENTION

Referring in detail now to the drawings, wherein similar parts of embodiments of the present inventions are identified by like reference numbers, there is seen in FIG. 1 a multiclip module (MCM) packaging of integrated circuits, generally illustrated as 10. The package of integrated circuits 10 comprises a substrate 12, (e.g., L/D or printed circuit board (PCB) substrate) a suitable dielectric underfill 13a disposed on substrate 12, an inteposer, generally illustrated as 14, mounted on dielectric underfill 13a, a dieletric underfill 13b selectively disposed on the interposer 14, and a plurality of integrated circuits 16 electrically coupled to the substrate 12 through the dieletric underfill 13b, the interposer 14, and underfill 13a. Therefore, the interposer 14 of the present invention is introduced in the package of integrated circuits 10 between the substrate 12 and the integrated circuits 16.

The integrated circuits 16 may be mounted on the interposer 14 by any suitable means, such as by flip-chip solder connection or wirebonding, or the like, depending on the system performance requirements. The structure of the interposer 14 may be adjusted for any type of chip-level connection. For example, and as shown in FIG. 1, a plurality of vias 20 may be formed to provide electrical paths to and from the substrate 12 for power and signal distribution. A plurality of passive components 24 may be placed on the interposer 14 directly underneath the integrated circuits 16 in order to reduce electrical interconnection lengths and thus decrease parasitic inductances. One of the possible passives used in this application may a decoupling chip capacitor. All types of resistor and high-Q inductors may also be incorporated in the interposer 14 by using well-developed processing techniques. It is to be understood that instead of vertical electrical interconnection, optical free space transmission may be used. In such case, instead of chip solder bumps, VCSELs (Vertical Cavity Surface Emitting Laser) and PDs (photodiods) may be attached or coupled to the integrated circuits 16. It is well known that a VCSEL transforms an electrical signal into a light signal and transmits it through an open-through hole formed in the interposer 14, and that a PD recieves optical signals transmitted to an integrated circuit or chip.

The interposer 14 of the present invention is preferably a silicon interposer comprising a silicon substrate 14s including a top surface 14t, a cladding layer 28, a waveguide layer 32, and a cladding layer 34 with a cladding surface 34b. Thus, cladding layers 28 and 34, as well as waveguide layer 32, are all preferably formed from silicon. In a preferred embodiment of the invention, cladding layers 28 and 34 are high-porosity porous silicon layers having a porosity ranging from about 20% to about 80%, or a density ranging from about 0.40 grams per cubic centimeter (g/cc) to about 1.9 g/cc. More preferably, the porosity of cladding layers 28 and 34 range from about 40% to about 60%. The waveguide layer 32 is preferably a low-porosity porous silicon layer having a porosity ranging from about 25% to about 50%, more preferably from about 30% to about 40%; or a density ranging from about 1.2 g/cc to about 1.8 g/cc, more preferably from about 1.4 g/cc to about 1.7 g/cc. Therefore, porosity of the cladding layers 28 and 34 is greater than the porosity of the waveguide layer 32, and the density of the cladding layers 28 and 34 is less than the density of the waveguide layer 32. Preferably, the porosity or density of cladding layer 28 generally equals the porosity or density of cladding layer 34.

The cladding layers 28, 34 and the waveguide layer 32 respectively terminate in opposed up-turned arcuate ends 28a—28a, 34a—34a, and 32a—32a (see FIG. 5) and opposed up-turned arcuate sides 28b—28b, 34b—34b and 32b—32b (see FIG. 7), such that cladding layers 28, 34 and waveguide layer 32 are essentially respectively saucer or bowl shaped from a perspective or 3-D view point. The up-turned arcuate ends 28a—28a, 34a—34a, 32a—32a and up-turned arcuate sides 28b—28b, 34b—34b, 32b—32b, all terminate in top surface 14t of the silicon substrate 14s. Therefore, as indicated, one embodiment of the present invention provides the interposer 14 preferably comprising a silicon body having the surface 12s and cladding layer 28 including a pair of opposed cladding ends 28a—28a terminating in the top surface 14t. The waveguide layer 32 includes the pair of opposed waveguide ends 32a—32a and extends through the silicon body in contact with the waveguide layer 32 and has the opposed waveguide ends 32a—32a terminating in the top surface 14t. The interposer 14 further includes the cladding layer 34 having the cladding surface 34s and formed in the silicon body in contact with the waveguide layer 32 such that cladding surface 34s is generally aligned with top surface 14t of the silicon substrate 14s. As previously indicated, cladding layers 28, 32 and 34 preferably has a porosity ranging from about 40% to about 60%, and waveguide layer 32 preferably has a porosity ranging from about 25% to about 50%. Any suitable optical devices, such as surface emitting laser 44 and photodiods 46, may be disposed on up-turned arcuate ends 32a—32a (see FIG. 8) such as to be in optical communication with waveguide layer 32. A suitable capping layer 48, which comprises $SiO_2$, $Si_2N_3$ or the like, may be disposed on surface 12s of substrate 12 and surface 34s of cladding layer 34, as best shown in FIG. 8.

Referring again now to FIGS. 3–8 for a method for fabricating the interposer 14, substrate 14s (i.e., silicon substrate 14s) is coated with photoresist mask 38 having patterned opening 40 (see FIGS. 3–4). If undercut problems are of concern, a hard-mask may be used instead of photoresist masks 38. The material selected for the photoresist mask 38 is preferably one which is etchresistant to concentrated (e.g., up to 30%) HF acid solutions. The mask 38 may be patterned according to any designed desired shape in the waveguide layer 32. After the photoresist masks 38 have been patterned as desired, alternating porous silicon layers are then formed in the silicon substrate 14s by an suitable means, preferably by means of electrochemical (anodic) etch of the silicon substrate 14s. Broadly, the cladding layers 28, 34 and the waveguide layer 32 are preferably formed in sequence by electro-chemical etching, commencing with the upper cladding layer 34. Because the silicon substrate 14s is porous, etching proceeds from the top surface 14t and through the silicon body to form first cladding layer 34, then form waveguide layer 32, and subsequently form cladding layer 28. Thus, cladding layer 34 is formed first, then the waveguide layer 32 is formed as etching proceeds through the silicon substrate 14s, and then cladding layer 28 is formed.

More specifically with respect to the procedure for forming the interposer 14 having cladding layers 28, 34 and waveguide layer 32, a doped p$^+$ Si wafer with resistivity of 5–15×10$^{-3}$ Ωcm may be used as the silicon substrate 14s. Subsequent to masking of the Si substrate 14s, it is subjected to electro-chemical etch for forming porous Si layers. The electro-chemical cell for etching and the method of porous Si formation are well known to those skilled in the art. See *Properties of Porous Silicon* edited by L. Canham, EMIS data reviews Series No. 18, Published by INSPEC London UK ISN: 0 85296 932 5. The formation of all three layers (clad 38, core 32, clad 28) is realized in one run, i.e., the substrate 14s is immersed in the etching solution and the changes in layer porosity can be achieved simply by changing the anodization current during the process. For the present description, the electrolyte is 25% ethonoic or water solution of hydrofluoric (HF) acid. First, the upper cladding 34 is formed by anodization at a current density ranging from about 30 mA/cm$^2$ to about 200 mA/cm$^2$. A current density of about 100 mA/cm$^2$ provides a suitable porosity of the upper cladding layer 34 (i.e., a porosity of about 50%). The etch rate may range from about 2 $\mu$m/min to about 9 $\mu$m/min. At a current density of about 100 mA/cm$^2$, the etch rate is about 5 $\mu$m/min. The etch rates are calibrated empirically. It should be noted that the etch front is propagating from the top surface 14t of the silicon substrate 14s into its associated bulk. Since the formed structure is porous the electrolytic solution may penetrate through the pores and reach the bottom of the respective porous layers, and therefore etching continues underneath the respective porous layers. When the required thickness of the upper cladding layer 34 is achieved, the anodization current density is changed to a current density ranging from about 5 mA/cm$^2$ to about 30 mA/cm$^2$ for forming the waveguide layer 32. A current density of about 10 mA/cm$^2$ produces porous Si of a suitable porosity (e.g., a porosity of about 35%) with the etch rate of about 0.5 $\mu$m/min. The etch rate for producing the upper cladding layer 32 may range from about 0.2 $\mu$m/min to about 2.0 $\mu$m/min. When the required thickness of the waveguide layer 32 is achieved, the current density is set back to the initial value (e.g., about 30 mA/cm$^2$ to about 200 mA/cm$^2$) that was employed in forming the upper cladding layer 34 in order to form the lower cladding layer 28 with a suitable porosity (e.g., a porosity of about 50% may be formed by a current density of about 100 mA/cm$^2$). When the etching processes is complete the substrate 14s is removed from the etching tank and is dried in order to clean the pores from the etching solution. A range of different porosities (e.g., from about 20% to about 80%) may be achieved by this technique by a choice of appropriate parameters such as doping level of the Si substrate 14s, HF concentration in the electrolyte, and anodization current.

Porosity of the porous silicon layers may be varied in the range of 20–80%. Variations of the porosity may be achieved by changing the anodization conditions. For this range of porosities, refractive index of non-oxidized porous silicon may vary from about 2.7 to about 1.5 and from 1.6 to 1.2 for completely oxidized porous silicon. To form a layered structure (high porosity/low porosity/high porosity) as the one shown in FIGS. 5–7, the anodization conditions should be adjusted during the etching procedure. A front cut of the waveguide is depicted in FIGS. 5 and 7. Since porous silicon etching is essentially isotropic, a nearly semi-cylindrical shape for the cladding layers 28, 34 and waveguide layer 32 may be obtained. As previously indicated, after the cladding layers 28, 34 and the waveguide layer 32 are formed, they may be expanded, such as by oxidation; more specifically, by oxidation of the substrate 14s in a suitable plasma processing reactor which particularly oxidizes the associated cladding layers 28, 34 and the waveguide layer 32.

Depending on the wavelength of the light to be transmitted through the waveguide, a porous silica (SiO$_2$) lightguide may be used. To form a waveguide from porous silica, formation of a porous silicon structure should be followed by silicon oxidation. Oxidation of porous silicon is a high temperature process and requires an extensive annealing of the substrate at temperatures above 1000° C. In addition, volume of the material increases by a factor of about 2.1 during the oxidation. Refractive index variations in oxidized porous silicon are significantly less than for non-oxidized porous silicon. It should be noted that porous silicon cannot be completely oxidized below a critical porosity of about 46%. In order to oxidize the porous Si waveguide layers 28, 34, and 32 without damaging and significant total volume expansion, the porosity of all porous layers should be above about 55%. The substrate 14s with porous silicon waveguide is capped with cap 48 to avoid possible contaminations. The capping layer is patterned to form openings for in/output of the light signal (see FIG. 8). VCSEL 44 and PD 46 (coupled to the ICs 16) are attached to the openings.

Size of the respective layers (e.g., waveguide layer 32) may be varied according to the design rules given. Typical dimensions for a waveguide would be: 3–15 $\mu$m for lower cladding layer 28, 1–10 $\mu$m for the core layer 32, and 3–15 $\mu$m for the upper cladding layer 34. Thus, the total size of the waveguide may be about 7–40 $\mu$m. Depending on the difference in the cladding/core refractive indexes the width of the cladding/core layers can be substantially varied. For a multi-mode waveguide the core layer 32 can be made up to 30 $\mu$m in thickness. Since there is no cross-talk between the lightguides, the transmission lines may be placed as close as 5–10 $\mu$m without increasing losses or delays; thus, providing a hugh potential for reducing the interconnect pitch. In addition, to reduce cladding/core boundary scattering losses, a graded index waveguide may be formed. In this case the porosity of porous silicon is gradually increased from the core layer to the cladding layer. The light modes are still bound in the core but the scattering loss will be reduced. However, fabrication of the graded index waveguide may be more complicated.

The invention will be illustrated by the following set forth example which is being given here by way of illustration only and not by way of any limitation. Any parameters such as concentrations, mixing proportions, temperatures, pressure, rates, compounds, etc., submitted in this example are not to be construed to unduly limit the scope of the invention.

EXAMPLE I

For each particular waveguide design, the shape of the waveguide bending (curvature) at the end of the waveguide may be carefully evaluated. Varying the depth of the porous silicon layers can change curvature of the core layer bending at the ends of the waveguide. To provide an evaluation of the feasibility of the waveguide structure proposed, the light bending properties of the porous silicon waveguides for a waveguide structure shown in FIG. 10 may be evaluated.

Assuming that the core of the waveguide 32 is made of porous silicon with 35% porosity, which can easily be obtained with standard porous silicon etching technique, the corresponding refractive index is $n_2$, as shown in FIG. 10. Increasing the porosity of the lower cladding layer 28. It is to be noted that in FIG. 10 the waveguide layer 32 is rotated vertically 180 degrees; thus, the lower cladding 28 is on the top, a refractive index (RI) difference may be achieved which may allow a total internal reflection of the light at angles smaller than a critical angle. It is to be noted that in FIG. 9 the values of the refractive index for different porous silicon porosities may be discovered from any suitable literature. In FIG. 9 the refractive index of the lower cladding 28 is $n_1$ and of upper cladding layer 28 is also $n_1$. The results of the critical angle (CA) calculations are shown in FIG. 9. In the figure, the critical angle is plotted versus the porosity of the lower cladding layer 28. Since the range of refractive index change with porosity is rather large, it can be seen from FIG. 9 that critical angles of 30–50 degrees can be achieved. This means that the light incident on the boundary between the core 32 and the lower cladding 28 from the core side will be completely refracted at angles lower than critical angles.

To understand at which maximal incident angles the light will see the core 32/cladding 28 boundary in the waveguide, the following estimation was made based on the structure shown in FIG. 10. The width of the core 32 was taken to be 5 μm and R is the radius of the curvature of the waveguide bending at the end of the waveguide. In the FIG. 10 the light enters the waveguide 32 from the bottom opening of the core. Waveguide layer 32 includes arcuate upper waveguide boundary 32x and arcuate lower waveguide boundary 32y. The largest incident angle of the light on the boundary will be along the line A shown in the FIG. 10. Slope of the line B (see FIG. 10) at tangential point 60 (i.e., the point where line or plane A intersects arcuate lower waveguide boundary 32y) can be found by calculating the derivative of the curvature function at point 60. The critical angle 2 is then calculated as an angle between lines A and B. The results of the calculation for different radius of curvature R are shown in the following Table I:

TABLE I

| Radius(μm) | 10 | 13 | 15 | 20 | 25 | 30 |
|---|---|---|---|---|---|---|
| Incident Angle [deg]$_2$ | 60 | 53.1 | 48.2 | 41.4 | 36.8 | 33.6 |

It can be seen from Table I that for radii R of curvature larger than about 15, the incident angle of light on the core/cladding boundary is less than about 50 and is in the range of from about 50 to about 30. From FIG. 9 it follows that the critical angles in the same range can be obtained with the cladding porosities of about 45–55%. This range of porosities can be easily obtained with standard porous silicon etching procedures.

CONCLUSION

Thus, by the practice of the present invention there is provided a multifunctional interposer 14 with an integrated waveguide 32 which can be used in high-end MCM packages for a variety of applications. Optical waveguides, compared to their electrical counterparts have no capacitive of inductive losses, no cross-talk, and no RC signal transmission delays. Integration of optical interconnects into silicon interposer 14 will allow drastic increase in the interaction speed between integrated circuits mounted on the MCM. In addition to porous silicon or silica lightguides, the silicon interposer 14 can be used as a carrier for polymer waveguides. Such polymer waveguides can be built into the substrate, by formation of deep trenches in the silicon interposer 14 and filling them with, e.g., polyimide. The waveguide core layer 32 can be formed by doping the polymer.

The waveguide layer 32 configuration of the present invention will allow fast transmission of signals between the chips on the package, without cross-coupling and parasitic delays. Different types of planar optical waveguides can be formed in silicon. The waveguide described uses porous silicon as a light conducting media. Porous silicon of different porosities has different density and hence different refractive index. Thus, if the core layer of the porous silicon waveguide is made from the low porosity porous silicon and the cladding layers are made from the higher porosity porous silicon, light waves will be confined within the core. This enables formation of a light-guiding structure. The silicon interposer 14 with waveguide 32 is not limited to a porous silicon waveguide structure. Standard silica planar waveguides with doped silica cores may also be integrated into the interposer 14. Standard silica (non-porous) waveguide (i.e., $SiO_2$ waveguides) have much lower optical losses.

Many functions may be performed "on package," without leading the signal out of the multiple chip module (MCM). In many cases, very fast communication between integrated circuits is required, e.g., multiple processors on main frame computers or CPU and Cache memories on PC chips or digital and analog circuits for RF application etc. To enable fast communication between ICs of the MCM, the optical interconnections of the present invention may be employed by integrating optical waveguides 32 into the interposer 14. Several types of planar optical waveguiding structures can be fabricated, such as by example, a waveguide from porous silicon formed in the silicon substrate by anodic etch. Both the core and the claddings of the waveguide are formed from porous silicon, however, the core layer has low porosity (higher density) and therefore can confine the light waves.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for producing light-guiding structure comprising:

providing a substrate having a top substrate surface;

forming in the substrate a first cladding layer having a first porosity value, said first cladding layer having a body portion disposed below said top substrate surface and one or more end portions terminating in said top substrate surface;

forming in the substrate a waveguide core layer in contact with the first cladding layer and having a second porosity value less than the first porosity value, said waveguide layer having a body portion disposed below said top substrate surface and one or more portions terminating in said top substrate surface; and forming in the substrate a second cladding layer in contact with the waveguide core layer and having a third porosity value greater than the second porosity value, said second cladding layer having a portion terminating in said top substrate surface.

2. The method of claim 1 wherein said second cladding layer has a top cladding surface which is generally aligned with the top substrate surface.

3. The method of claim 1 wherein said first porosity value generally equals said third porosity value.

4. The method of claim 2, wherein said first porosity value generally equals said third porosity value.

5. The method of claim 1 wherein said first cladding layer and said second cladding layer comprise silicon.

6. The method of claim 1 additionally comprising expanding said first cladding layer, said waveguide core layer, and said second cladding layer.

7. The method of claim 1 additionally comprising oxidizing said first cladding layer, said waveguide core layer, and said second cladding layer.

8. The method of claim 1 additionally comprising determining the first porosity value of intended first cladding layer prior to forming said first cladding layer.

9. The method of claim 8 wherein said determining of said first porosity value comprises providing a value for a width of first cladding layer, and finding the angle of a first plane along a first side of intended first cladding layer with a second plan tangential to a second side of intended first cladding layer at a point of intersection of the first plane with the second side.

10. A method for producing an interposer comprising:
   providing a substrate having a top substrate surface;
   forming in the substrate a first cladding layer having a first density value, said first cladding layer having a body portion disposed below said top substrate surface and one or more end portions terminating in said top substrate surface;
   forming in the substrate a waveguide core layer in contact with the first cladding layer and having a second density value greater than the first density value, said waveguide layer having a body portion disposed below said top substrate surface and one or more portions terminating in said top substrate surface; and
   forming in the substrate a second cladding layer terminating in said top substrate surface and in contact with the waveguide core layer and having a third density value less than the second density value.

11. An interposer comprising a silicon body having a silicon surface, a first cladding layer including a pair of first opposed cladding layer ends and a body portion extending through said silicon body, the first cladding layer having its body portion disposed below the silicon surface and having its opposed cladding layer ends terminating in said silicon surface; a core layer including a pair of opposed core layer ends and a body portion extending through said silicon body in contact with said first cladding layer, the core layer having its body portion disposed below the silicon surface and having its opposed core layer ends terminating in said silicon surface; and a second cladding layer including a second cladding surface and disposed in said silicon body in contact with said core layer and such that said second cladding surface is generally aligned with said silicon surface.

12. The interposer of claim 11 wherein said first cladding layer and said second cladding layer have a porosity ranging from about 20% to about 80%.

13. The interposer of claim 12 wherein said core layer has a porosity which is less than the porosity of the first and second cladding layers.

14. The interposer of claim 13 wherein said core layer has a porosity ranging from about 25% to about 50%.

* * * * *